(12) United States Patent
Wuebben et al.

(10) Patent No.: US 10,263,101 B2
(45) Date of Patent: Apr. 16, 2019

(54) SEMICONDUCTOR DEVICE WITH DEEP DIFFUSION REGION

(71) Applicant: Infineon Technologies AG, Neubiberg (DE)

(72) Inventors: Thomas Wuebben, Unterschuett (AT); Peter Irsigler, Obernberg/Inn (AT); Hans-Joachim Schulze, Taufkirchen (DE)

(73) Assignee: Infineon Technologies AG (DE)

( * ) Notice: Subject to any disclaimer, the term of this patent is extended or adjusted under 35 U.S.C. 154(b) by 48 days.

(21) Appl. No.: 15/295,109

(22) Filed: Oct. 17, 2016

(65) Prior Publication Data

US 2017/0117395 A1 Apr. 27, 2017

(30) Foreign Application Priority Data

Oct. 27, 2015 (DE) .......... 10 2015 118 315

(51) Int. Cl.
*H01L 29/06* (2006.01)
*H01L 29/36* (2006.01)
*H01L 29/66* (2006.01)
*H01L 29/78* (2006.01)
(Continued)

(52) U.S. Cl.
CPC ........ *H01L 29/7397* (2013.01); *H01L 21/265* (2013.01); *H01L 29/0619* (2013.01); *H01L 29/0696* (2013.01); *H01L 29/36* (2013.01); *H01L 29/66348* (2013.01); *H01L 29/66734* (2013.01); *H01L 29/7813* (2013.01)

(58) Field of Classification Search
CPC ............ H01L 29/7397; H01L 29/0619; H01L 29/7813; H01L 29/66734; H01L 29/0696; H01L 29/66348; H01L 29/36; H01L 21/265; H01L 29/7393; H01L 27/2454; H01L 29/7428; H01L 29/42304
See application file for complete search history.

(56) References Cited

U.S. PATENT DOCUMENTS 9,024,413 B2 5/2015 Laven et al.
2005/0167742 A1 8/2005 Challa et al.
(Continued)

FOREIGN PATENT DOCUMENTS

DE 20 2004 021 424 U1 2/2008
DE 10 2014 100 249 A1 7/2014

*Primary Examiner* — Moazzam Hossain
*Assistant Examiner* — Stanetta D Isaac
(74) *Attorney, Agent, or Firm* — Design IP

(57) ABSTRACT

A method of processing a semiconductor device, comprising: providing a semiconductor body having dopants of a first conductivity type; forming at least one trench that extends into the semiconductor body along a vertical direction, the trench being laterally confined by two trench sidewalls and vertically confined by a trench bottom; applying a substance onto at least a section of a trench surface formed by one of the trench sidewalls and/or the trench bottom of the at least one trench, such that applying the substance includes preventing that the substance is applied to the other of the trench sidewalls; and diffusing of the applied substance from the section into the semiconductor body, thereby creating, in the semiconductor body, a semiconductor region having dopants of a second conductivity type and being arranged adjacent to the section.

14 Claims, 6 Drawing Sheets

(51) Int. Cl.
 H01L 21/265 (2006.01)
 H01L 29/739 (2006.01)

(56) References Cited

U.S. PATENT DOCUMENTS

2012/0098057 A1* 4/2012 Kim .................... H01L 21/2255
 257/330
2015/0214930 A1 7/2015 Laven et al.

* cited by examiner

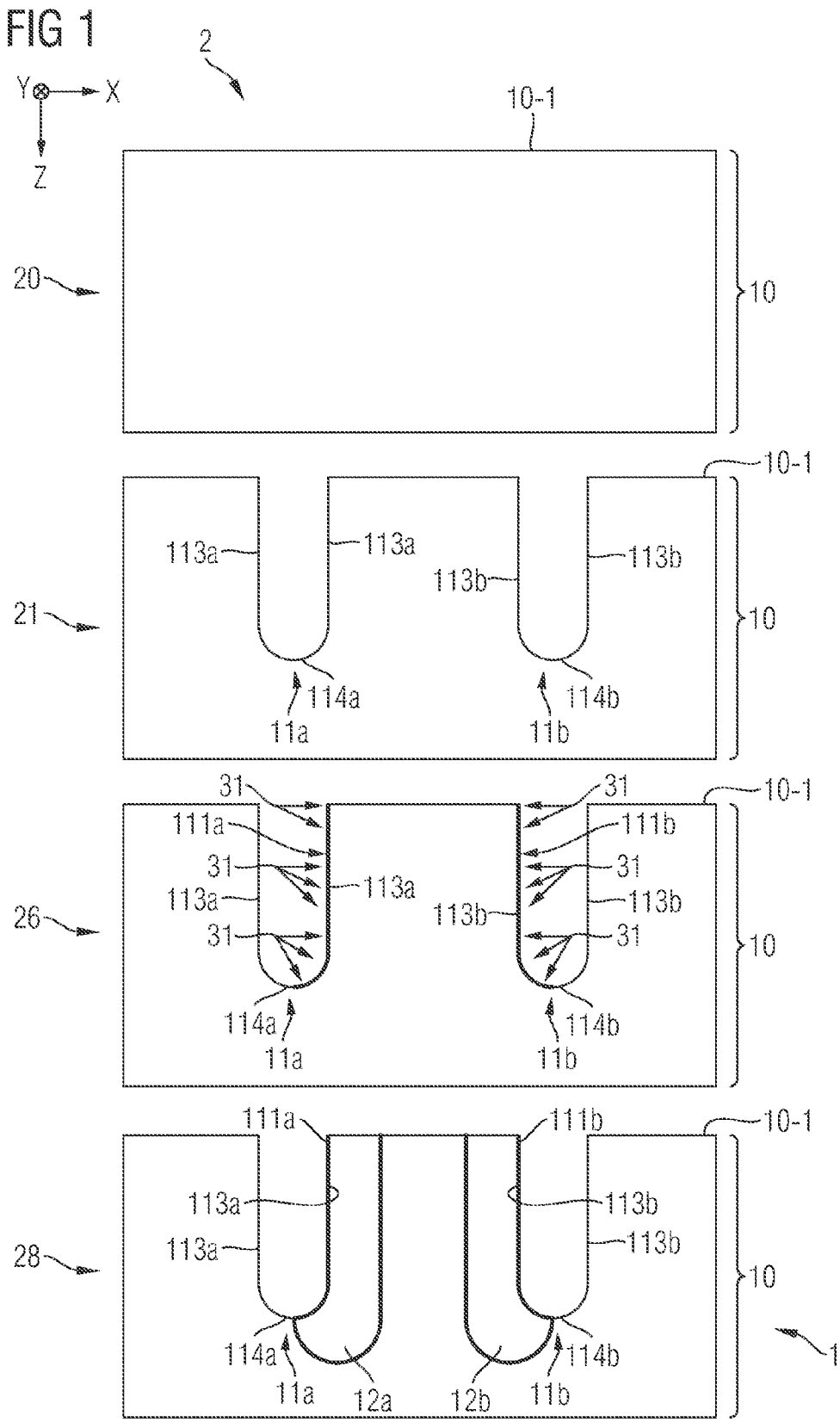

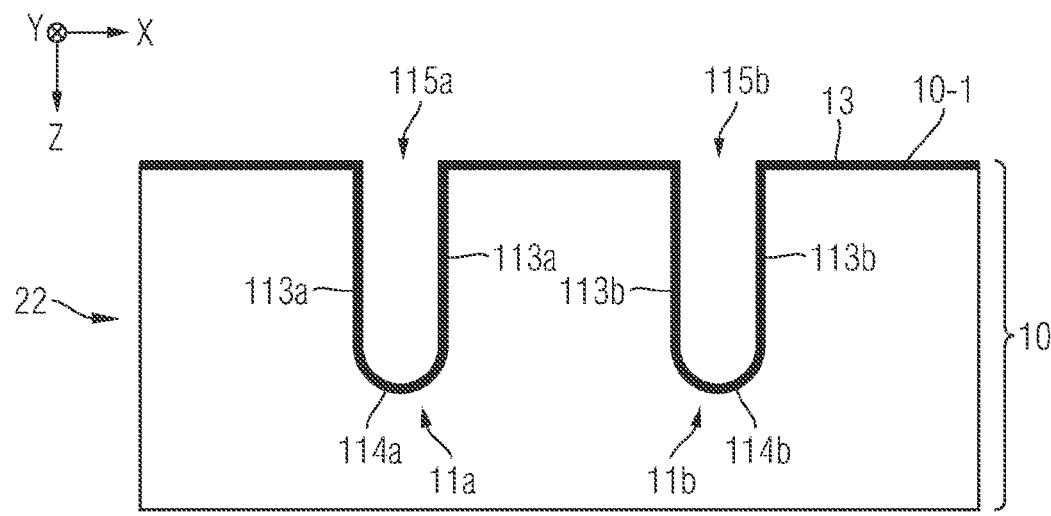
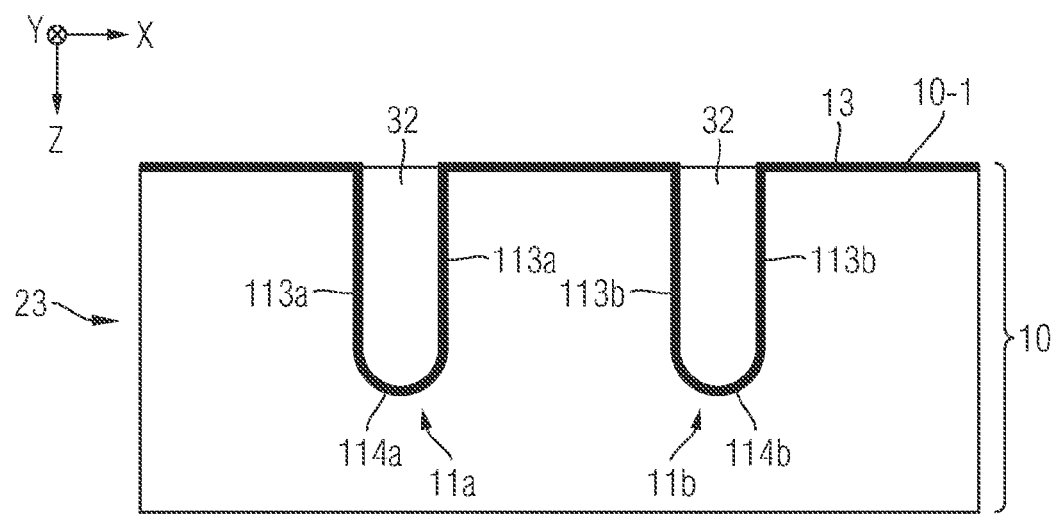

SEMICONDUCTOR DEVICE WITH DEEP DIFFUSION REGION

FIELD

This specification refers to embodiments of a method of processing a semiconductor device and to embodiments of a power semiconductor transistor. In particular, this specification refers to embodiments of semiconductor device having deep doped semiconductor regions created by means of diffusion.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

Such power semiconductor devices, e.g., a power semiconductor transistor, may exhibit a plurality of doped semiconductor regions, such as a doped body region, a doped source region, a doped drift region, a doped contact region, and a doped field stop layer, to name of few.

For example, a doped semiconductor region may be created by means of diffusion, implantation and/or epitaxy. Diffusion usually involves carrying out a temperature process for a certain amount of time.

SUMMARY

According to an embodiment, a method of processing a semiconductor device comprises: providing a semiconductor body having dopants of a first conductivity type; forming at least one trench that extends into the semiconductor body along a vertical direction, the trench being laterally confined by two trench sidewalls and vertically confined by a trench bottom; applying a substance onto at least a section of a trench surface formed by one of the trench sidewalls and/or the trench bottom of the at least one trench, wherein applying the substance includes preventing that the substance is applied to the other of the trench sidewalls; and diffusing of the applied substance from the section into the semiconductor body, thereby creating, in the semiconductor body, a semiconductor region having dopants of a second conductivity type and being arranged adjacent to the section, wherein the semiconductor region is arranged adjacent to only one of the two trench sidewalls.

According to another embodiment, a power semiconductor transistor comprises a semiconductor body and at least one transistor cell, the at least one transistor cell having: a semiconductor drift region included in the semiconductor body and having dopants of a first conductivity type; a semiconductor body region included in the semiconductor body and having dopants of a second conductivity type; a source region, wherein the semiconductor body region isolates the source region from the semiconductor drift region; a trench extending into the semiconductor body along a vertical direction and comprising a control electrode electrically insulated from each of the semiconductor drift region, the semiconductor body region and the source region; and a semiconductor region having dopants of the second conductivity type and being arranged adjacent to the trench and separated from the semiconductor body region, wherein a transition between the trench and the semiconductor region extends along a trench sidewall of the trench, and wherein a dopant concentration of the semiconductor region adjacent to the trench sidewall amounts to a value that is within a range of 50% to 150% of a fixed dopant concentration value at any point along at least 60% of the total extension of the semiconductor region in the vertical direction.

According to another embodiment, a power semiconductor transistor comprises a semiconductor body and at least one transistor cell, the at least one transistor cell having: a semiconductor drift region included in the semiconductor body and having dopants of a first conductivity type; a semiconductor body region included in the semiconductor body and having dopants of a second conductivity type; a source region, wherein the semiconductor body region isolates the source region from the semiconductor drift region; a trench extending into the semiconductor body along a vertical direction and comprising a control electrode electrically insulated from each of the semiconductor drift region, the semiconductor body region and the source region; and a semiconductor region having dopants of the second conductivity type and being arranged adjacent to the trench and separated from the semiconductor body region, wherein a transition between the trench and the semiconductor region extends along a trench sidewall of the trench, and wherein a dopant concentration of the semiconductor region adjacent to the trench sidewall changes, in a portion amounting to at least 80% of the total extension of the semiconductor region in the vertical direction, by at least 30% from a dopant concentration value being present in said portion.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 1 schematically illustrates different stages of a method of processing a semiconductor device according to one or more embodiments;

FIG. 2 schematically illustrates a step of a method of processing a semiconductor device according to one or more embodiments;

FIG. 3 schematically illustrates a step of a method of processing a semiconductor device according to one or more embodiments;

DETAILED DESCRIPTION

Figure 4:
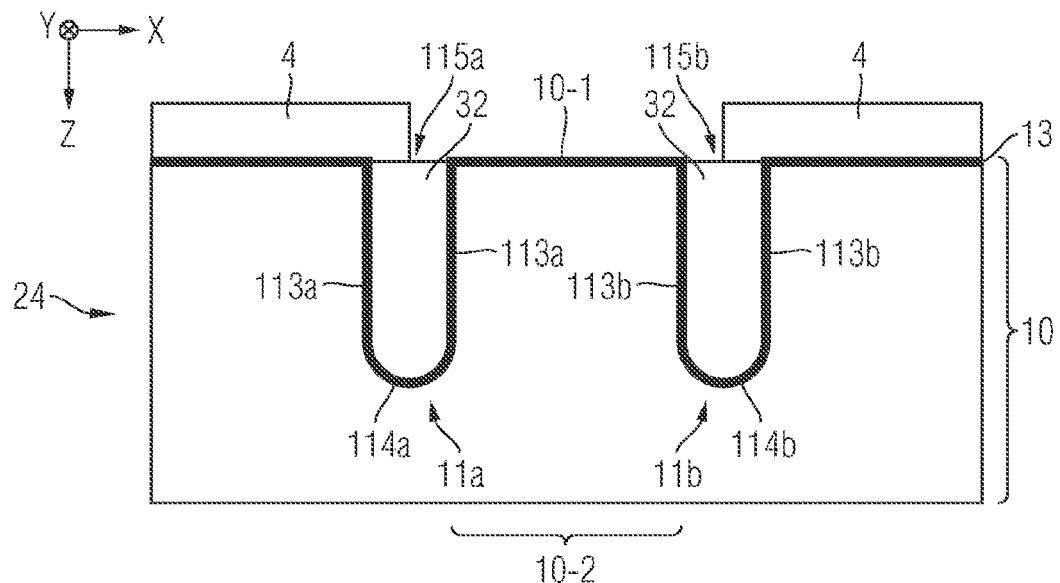
FIG. 4 schematically illustrates a step of a method of processing a semiconductor device according to one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be a vertical direction that is perpendicular to both the first lateral direction X and the second lateral direction Y.

In this specification, n-doped may be referred to as "first conductivity type" while p-doped may be referred to as "second conductivity type". Alternatively, opposite doping relations can be employed so that the first conductivity type can be p-doped and the second conductivity type can be n-doped. Yet alternatively, the terms "first conductivity type" and "second conductivity type" may both refer to either n-doped or p-doped. Thus, in one or more embodiments, the second conductivity type may be identical to the first conductivity type. In one or more other embodiments, the second conductivity type may be complementary to the first conductivity type.

Further, within this specification, the term "dopant concentration" may refer to an average dopant concentration or, respectively, to a mean dopant concentration or to a sheet charge carrier concentration of a specific semiconductor region or semiconductor zone, such as a semiconductor region within a trench. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

Specific embodiments described in this specification pertain to, without being limited thereto, a power semiconductor device that may be used within a power converter or a power supply, and to corresponding processing methods. For example, the power semiconductor device may comprise one or more power semiconductor cells, such as a monolithically integrated diode cell, and/or a monolithically integrated transistor cell, and/or a monolithically integrated IGBT cell, and/or a monolithically integrated MOS Gated Diode (MGD) cell, and/or a monolithically integrated MOSFET cell and/or derivatives thereof. Such diode cells and such transistor cells may be integrated in a power semiconductor module.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 50 V, more typically 500 V and above.

FIG. 1 schematically illustrates different stages of a method 2 of processing a semiconductor device according to one or more embodiments.

In a first step 20, a semiconductor body 10 is provided. The semiconductor body 10 may exhibit dopants of a first conductivity type. For example, the semiconductor body 10 is n-doped. The semiconductor body 10 may be provided as a part of a semiconductor wafer. For example, the semiconductor wafer may have a diameter of at least 200 mm, such as a diameter of 300 mm or a diameter even larger than 300 mm. For example, the semiconductor body 10 is a semiconductor wafer.

The semiconductor body 10 has a surface 10-1 that may extend along both the first lateral direction X and the second lateral direction Y, wherein each of these lateral extensions X and Y may be horizontal directions. Further, the semiconductor body 10 may extend along a vertical direction Z that is perpendicular to said lateral extensions X and Y, for example for at least along 10 µm, for at least 40 µm, for at least 60 µm, for at least 110 µm, or for even more than 180 µm.

Figure 8:
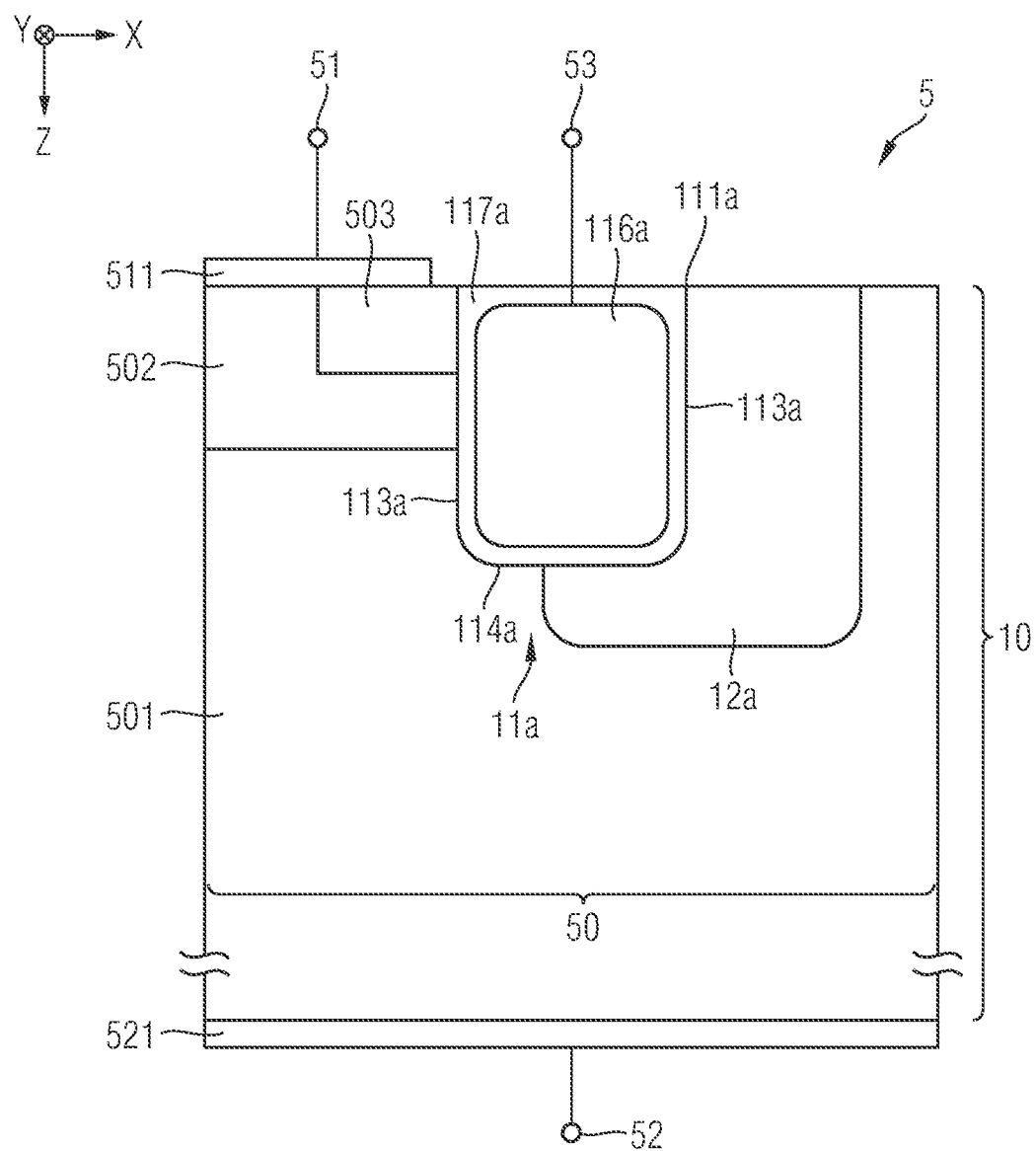
FIG. 8 schematically illustrates a section of a vertical cross-section of a power semiconductor transistor according to one or more embodiments.
Figure 9:
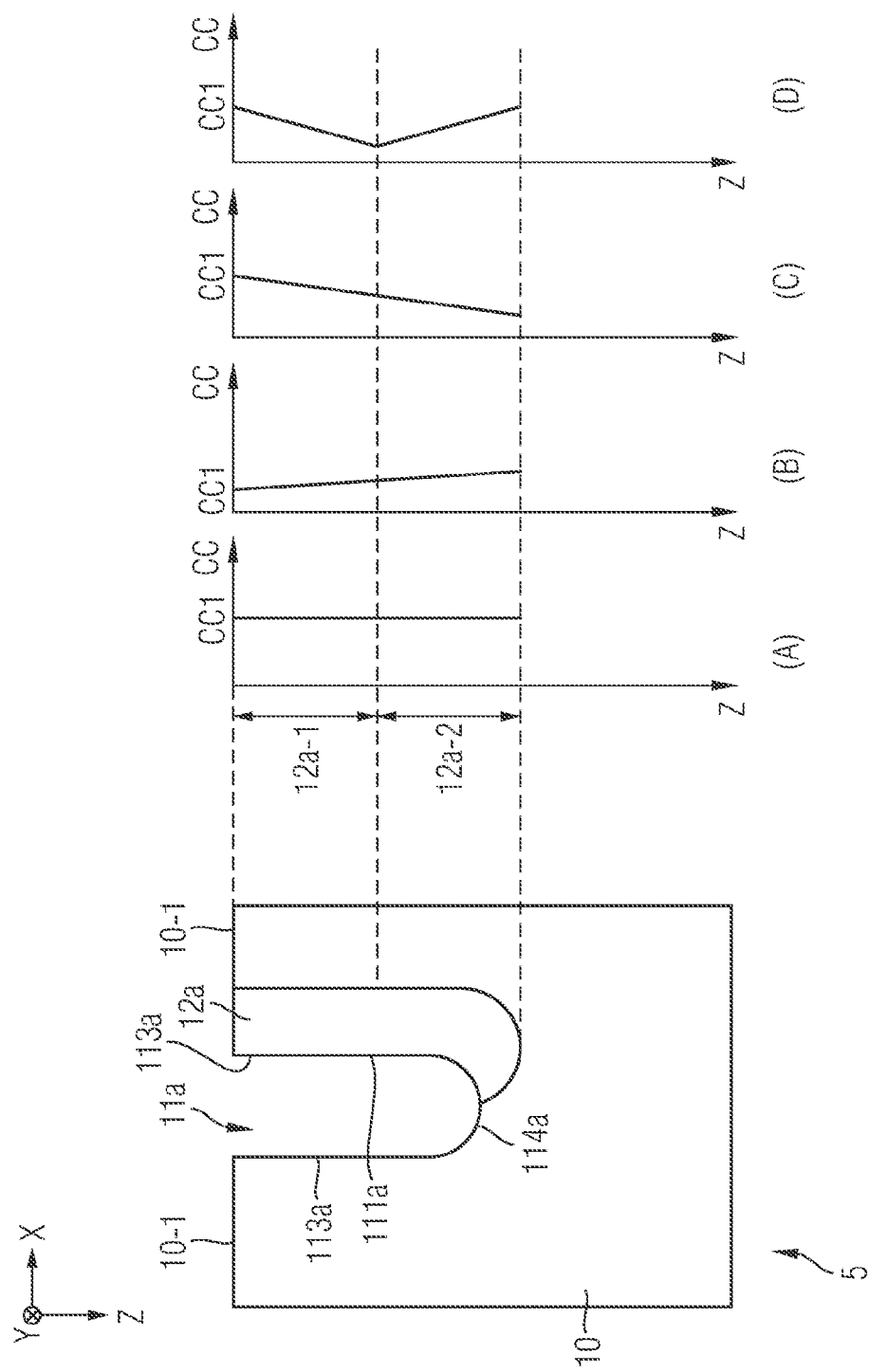
FIG. 9 schematically illustrates a section of a vertical cross-section of a processed semiconductor device according to one or more embodiments.

In a next step 21, at least one trench that extends into the semiconductor body 10 along the vertical direction Z is created. In FIG. 1-7, two of such a trench 11a, 11b are schematically illustrated, whereas FIG. 8 and FIG. 9 show only one of such trench 11a. It shall be understood that, in accordance with other embodiments, more than one trench or, respectively, more than two trenches can be created during step 21. For example, each trench that is created during step 21 forms a part of a transistor cell (not illustrated in FIG. 1), e.g., of a MOS control head, e.g., of a trench gate MOS control head. This optional aspect will be explained in more detail below. The step 21 of forming the at least one trench 11a, 11b (step 21) may include an etch processing step.

For example, the created trenches 11a, 11b extend along the vertical direction Z for at least 1 µm, for at least 2 µm, or for even more than 4 µm. The trenches 11a and 11b are laterally confined by respective two trench sidewalls 113a, 113b along the first lateral direction X. Further, the trenches 11a and 11b are vertically confined by a respective trench bottom 114a, 114b along the vertical direction Z. For example, the trench sidewalls 113a and 113b substantially extend in a direction parallel to the vertical direction Z and the trench bottoms 114a and 114b extend in a direction substantially parallel to the first lateral direction X and, at a transition from the trench bottoms 114a, 114b to the trench sidewalls 113a, 113b, also in the vertical direction Z; in other words, a transition between the trench sidewalls 113a, 113b to the trench bottoms 114a and 114b can be curved, as schematically illustrated in FIG. 1. For example, in the context of the present specification, the trench sidewalls 113a, 113b can be those parts of the trench surface that substantially only extend along the vertical direction Z. Further, the widths of the trenches 11a,11b along the first lateral direction X may each amount to less than 2 µm, or to even less than 1 µm. For example, the width of each trench 11a, 11b along the first lateral direction X is smaller than 40%, or even smaller than 20% of the total extension of the respective trench 11a, 11b along the vertical direction Z. Further, the trenches 11a and 11b may extend along the second lateral direction Y for at least 1 µm or for at least 2 µm.

In a further step 26, a substance 31 is applied onto at least a section 111a, 111b of a trench surface formed by one of the trench sidewalls 113a, 113b and/or the trench bottom 114a, 114b of the respective trench 11a, 11b. Simultaneously, it may be prevented that the substance 31 is applied also to the other of the two trench sidewalls 113a, 113b. Thus, in accordance with the embodiment illustrated in FIG. 1, the section 111a of the trench surface of the trench 11a is constituted by only the right one of the trench sidewalls 113a and parts of the trench bottom 114a, and not by the left one of the trench sidewalls 113a. Further, in accordance with this embodiment, the section 111b of the trench surface of the trench 11b is constituted by only the left one of the two trench sidewalls 113b and parts of the trench bottom 114b, and not by the right one of the two trench sidewalls 113b. Exemplary ways of preventing that the remaining part of the trench surface is exposed to the step of applying the substance 31 will be explained in more detail below.

In an embodiment, only a part of the trench bottom 114a, 114b contributes to the section 111a, 111b that is subjected to the application of the substance 31. For example, said part amounts to no more than 80% of the total extension of the trench bottom 114a, 114b along the first lateral direction X, to no more than 65%, or to no more than 60% of said total extension. Further, said part of the trench bottom 114a, 114b may amount to more than 5%, to more than 10% or to even more than 20% of said total extension of the trench bottom 114a, 114b along the first lateral direction X. For example, as schematically illustrated in each of FIG. 1 and FIGS. 5 to 7 and FIG. 9, said part of the trench bottom 114a, 114b that contributes to the section 111a, 111b may amount to approximately 40 to 60% of said total extension, wherein the remaining part of the trench bottom 114a, 114b is not subjected to the application of the substance 31, in accordance with one or more embodiments. This aspect will be exemplarily elucidated in more detail with regards to FIGS. 5-6.

Applying the substance 31 during step 26 may include at least one of a plasma deposition (PLAD), a tilt angle implantation, and an implantation along substantially only the vertical direction Z. For example, during a tilt angle implantation, it may be ensured that the angle between an ion implantation beam and the vertical direction Z is kept below 10°, below 8°, below 6° or even below 4°. Further, said angle can even amount to substantially 0°, such that the implantation occurs substantially only along the vertical direction Z. Further variants of such implantation will be explained in more detail below.

In a further step 28, a diffusion is carried out. Accordingly, the applied substance 31 may diffuse from the sections 111a, 111b of the trench surfaces into the semiconductor body 10. Thereby, semiconductor regions 12a, 13a are created that have dopants of a second conductivity type. The second conductivity type may be identical or complementary to the first conductivity type. For example, the created semiconductor regions 12a,12b may be p-doped regions. The semiconductor regions 12a, 12b can be arranged adjacent to the respective section 111a, 111b. For example, as indicated in FIG. 1, the semiconductor region 12a is arranged adjacent to the section 111a that has been exposed to the step of applying (step 26) the substance 31, and the semiconductor region 12b may be arranged adjacent to the section 111b of the trench surface of the trench 11b that has been exposed to the step of applying the substance 31. Further, the sections 111a and 111b may include at least a part of the respective trench bottom 114a, 144b, as exemplarily illustrated in FIG. 1.

Thus, in accordance with one or more embodiments, the created semiconductor region 12a may be arranged adjacent to only one of the two trench sidewalls 113a. For example, the created semiconductor region 12a is not arranged adjacent to the remaining parts of the trench surface of the trench 11a that has not been subjected to the application of the substance 31. Analogously, the created semiconductor region 12b is, for example, not arranged adjacent to the remaining parts of the trench surface of the trench 11b that has not been subjected to the application of the substance 31.

Further, in accordance with one or more embodiments, the created semiconductor region 12a, 12b may extend deeper into the semiconductor body 10 along the vertical direction Z as compared to the respective trench 11a, 11b. For example, the semiconductor region 12a extends into the semiconductor body 10 for more than 10%, for more than 30%, for more than 60%, or for even more than 100% of the total extension of the trench 11a, which can be, e.g., a distance along the vertical direction Z between the trench surface 10-1 and the lowest point of the trench bottom 114a. In other words, the lowest point of the semiconductor region 12a may be positioned deeper in the semiconductor body 10 as said lowest point of the trench bottom 114a. For example, a distance between these two lowest points along the vertical direction Z amounts to at least 1 □m, or at least 3 □m. A dopant concentration of the dopants of the second conductivity type at the lowest point of the created semiconductor region 12a can amount to at least $10^{15}$ cm$^{-3}$, to at least $10^{16}$ cm$^{-3}$, or to even more than $10^{17}$ cm$^{-3}$. The same may apply to the created semiconductor region 12b. Further, it shall be understood that, in contrast to the schematic illustration in FIG. 1, the created semiconductor regions 12a, 12b must not necessarily extend along the vertical direction Z starting from the surface 10-1 of the semiconductor body 10. Rather, also at least an upper part of the section (111a, 111b) forming trench sidewall 113a, 113b can be prevented from being subjected to the application of the substance 31. For example, only the trench bottom 114a, 114b or, respectively, a part thereof is exposed to the application of the substance 31.

Thus, with respect to the surface 10-1 of the semiconductor body 10, comparatively deep semiconductor regions 12a, 12b can be created by carrying out a diffusion process, wherein this diffusion process can be implemented with a comparatively low temperature and/or within a comparatively short period of time, since the distance the applied substance 31 has to diffuse into the semiconductor body 10 is comparatively low.

In accordance with the embodiments schematically illustrated in FIG. 1, a transition between the trench 11a, 11b and the created semiconductor region 12a, 12b arranged adjacent thereto may extend continuously along only one of the trench sidewalls 113a, 113b to the trench bottom 114a, 114b. For example, said transition may begin at the surface 10-1 of the semiconductor body 10 and may continuously extend along the vertical direction to the beginning of the trench bottom 114a, 114b and along the first lateral direction X (or in opposite direction) along parts of the trench bottom 114a, 114b. Further, depending on, e.g., at least one of a duration of the diffusion and a percentage of the trench bottom 114a, 114b that may contribute to said section 111a, 111b, the created semiconductor region 12a, 12b may extend laterally further along the trench bottom 114a, 114b, e.g., even such that it reaches the transition from the trench bottom 114a, 114b to the respective other one of the trench sidewalls 113a, 113b.

It shall, however, be understood that in accordance with further embodiments, the step of applying the substance 31 (step 26) can be carried out such that it is ensured that the substance 31 is applied to none of the trench sidewalls 113a, 113b. For example, to this end, the step 26 of applying the substance 31 can be carried out by a substantially vertical ion beam implantation in a direction substantially in parallel to the extension direction of the trenches 11a, 11b; e.g., substantially only in the vertical direction Z, wherein the latter formulation is intended to express, within the present specification, a beam direction in the vertical direction Z or within a deviation of, e.g., less than 0.15° from the vertical direction Z. To this end, the sidewalls 113a, 113b of the trenches 11a, 11b can be protected such they are not exposed to the implantation, which will be explained in more detail below. Further, as has been pointed out above, in an embodiment, only a part of the trench bottom 114a, 114b contributes to the section 111a, 111b that is subjected to the application of the substance 31. For example, said part amounts to no more than 80% of the total extension of the trench bottom 114a, 114b along the first lateral direction X, to no more than 65%, or to no more than 60% of said total extension. Further, said part of the trench bottom 114a, 114b may amount to more than 5%, to more than 10% or to even more than 20% of said total extension of the trench bottom 114a, 114b along the first lateral direction X.

Regarding now in more detail the step of applying the substance 31 (step 26) it shall be understood that the substance 31 can be gaseous and applying the substance 31 may include a masked diffusion process, e.g., instead of the implantation process exemplarily mentioned above. To this end, the surface 10-1 of the semiconductor body 10 can be masked with a mask (not illustrated) and the mask diffusion can be subsequently carried out, such that, e.g. only the section 111a, 111b of the surface of the trench 11a, 11b is exposed to the application of the substance 31.

For example, the substance 31 may include at least one of boron, aluminum and gallium. For example, such a substance is used in order to create p-doped semiconductor regions 12a, 12b, e.g., in case of an n-doped semiconductor body 10. In another embodiment, the substance may include at least one of phosphorus, antimony and arsenic. For example, such a substance is used in order to create n-doped semiconductor region 12a, 12b, e.g., in case of a p-doped semiconductor body 10.

Further, in accordance with an embodiment, a sputtering process may be carried out before applying, during step 26, the substance 31. Such sputtering process can be carried out in order to remove an oxide layer (not illustrated) present at the section 111a, 111b that came into being after forming the trench 11a, 11b or, respectively, after a masking layer (not illustrated in FIG. 1) has been formed. For example, a thickness of such an oxide layer may be smaller than 3 nm. Thus, in accordance with an embodiment, such sputtering process can ensure that the substance 31 is applied directly onto the surface of the trench 11a, 11b and may therefore support the subsequent diffusion step, since the applied substance 31 does not have to traverse through an oxide layer. Further, if the sputtering process is carried out after said masking layer has been formed, the sputtering process may be carried out such that said masking layer remains present on the semiconductor body 10 with a sufficient thickness, e.g., in regions that shall not become subjected to the application of the substance 31.

In the following, exemplary ways of preventing a remaining section of the trench surface from becoming subjected to the application of the substance 31 shall be explained in more detail:

For example, regarding the method step 22 schematically illustrated in FIG. 2, after the trenches 11a, 11b have created (step 21), a masking layer 13 can be formed at or on the trench surfaces formed by the sidewalls 113a, 113b and the trench bottoms 114a, 114b of the trenches 11a, 11b. As illustrated in FIG. 2, also the surface 10-1 of the semiconductor body 10 may also be covered with the masking layer 13. Creating the masking layer 13 (step 22) may include carrying out an oxidation processing step. Thus, the masking layer 13 may be formed by an oxide, such as silicon oxide.

Regarding now the method step 23 schematically illustrated in FIG. 3, after the masking layer 13 has been formed on the trench surfaces, the trenches 11a, 11b can be filled with a trench filling material 32. Said trench filling material 32 may include at least one of carbon, an oxide or another material that can be easily etched.

Figure 5:
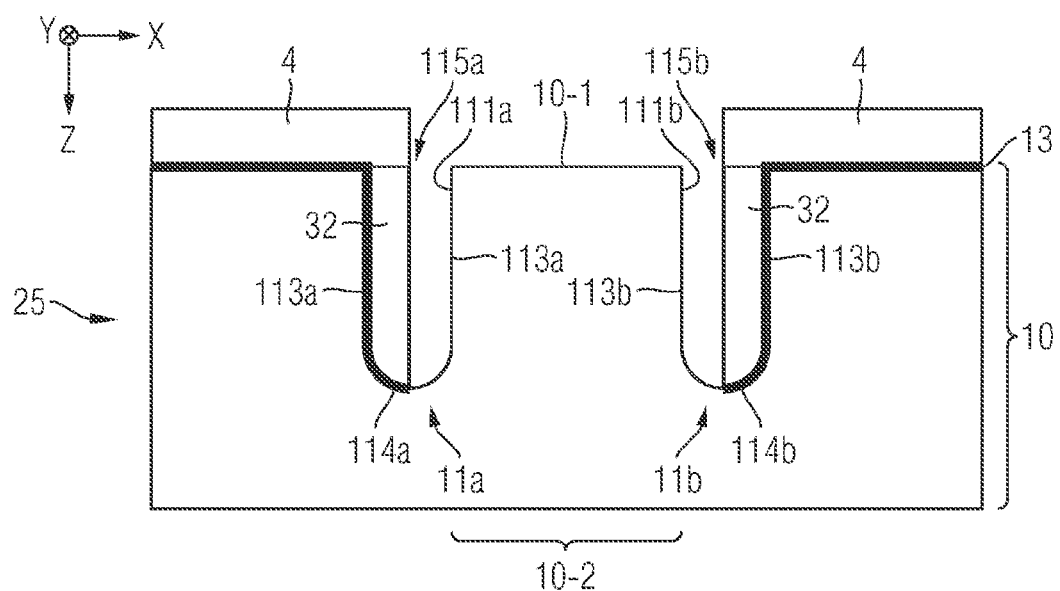
FIG. 5 schematically illustrates a step of a method of processing a semiconductor device according to one or more embodiments.

Further, regarding the method steps 24 and 25 schematically illustrated in FIG. 4 and FIG. 5, a mask 4 may be formed that only partially covers openings 115a, 115b of the trenches 11a, 11b. The step 24 of forming the mask 4 may include carrying out a trench lithography processing step, e.g., such that the trenches 11a, 11b become only partially opened. For example, the mask 4 covers at least 30% of the trench opening 115a. In another embodiment, the mask 4 may cover at least 50%, at least 70% or at least 90% of the trench opening 115a. For example, the part of the mask 4 that partially covers the opening 115a of the trench 11a is supported by the trench filling material 32 that has been filled into the trench 11a before the step of forming the mask 4. Thus, in accordance with an embodiment, at least 10%, at least 20%, at least 30% or at least 50% of the trench opening 115a is covered by the mask 4. The same may apply to the trench 11b.

In a next step 25, both a share of the trench filling material 32 that is not covered by the mask 4 and a part of the masking layer 13 adjacent to the share can be removed, as schematically illustrated in FIG. 5. Such removing may include carrying out an etch processing step, which may include, e.g., an anisotropic etch process. Thereby, said sections 111a, 111b become exposed such that they can later be subjected to the subsequent application (step 26) of the substance 31. As previously explained, before applying the substance 31, a sputtering process may be carried out so as to remove an eventual remaining masking layer or oxidation layer. Further, in an embodiment, within said removing step 25, only a part of the trench bottom 114a, 114b is exposed such that only said exposed part contributes, in the outcome, to the section 111a, 111b that may be subjected to the application of the substance 31. For example, said exposed part amounts to no more than 80% of the total extension of the trench bottom 114a, 114b along the first lateral direction X, to no more than 65%, or to no more than 60% of said total extension. Further, said part of the trench bottom 114a, 114b may amount to more than 5%, to more than 10% or to even more than 20% of said total extension of the trench bottom 114a, 114b along the first lateral direction X.

Figure 6:
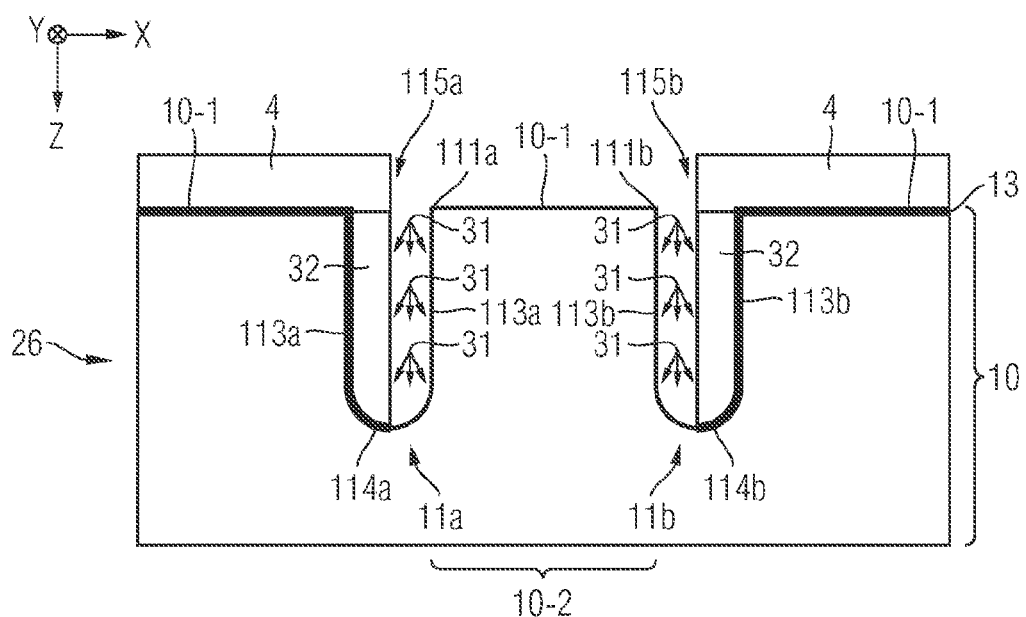
FIG. 6 schematically illustrates a step of a method of processing a semiconductor device according to one or more embodiments.
Figure 7:
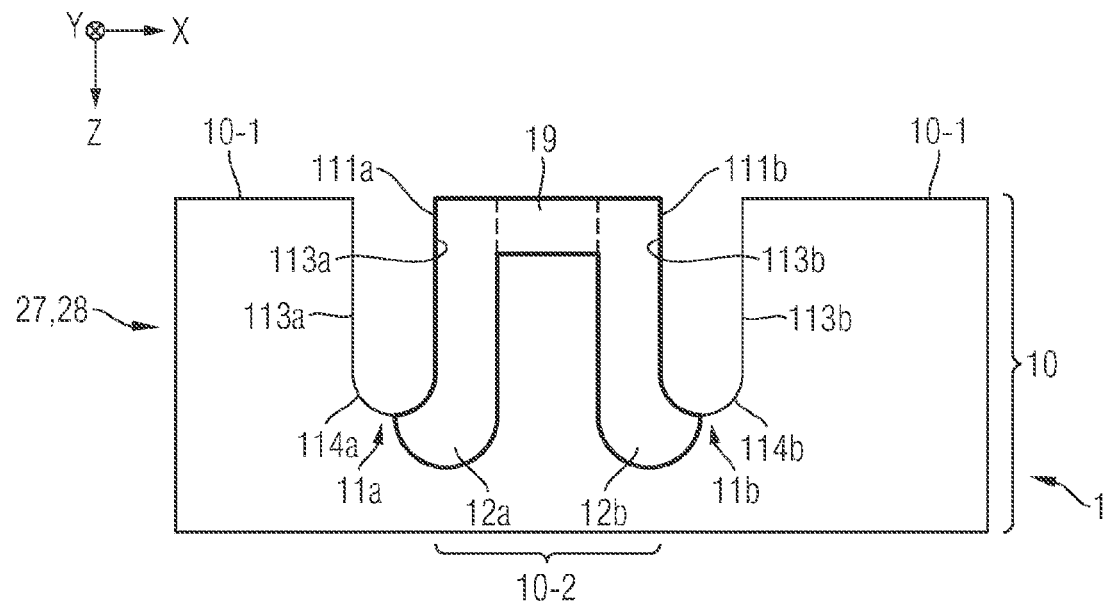
FIG. 7 schematically illustrates a step of a method of processing a semiconductor device according to one or more embodiments.

As schematically illustrated in FIG. 6, during the application (step 26) of the substance 31, the remaining share of the trench filling material 32 and/or the remaining part of the masking layer 13 may cover the remaining section of the trench surface, e.g., at least one of the two trench sidewalls 113a, 113b. Thereby, the covered trench sidewall (left trench sidewall 113a of trench 11a and right trench sidewall 113b of trench 11b in FIG. 6) is not subjected to the application of the substance 31.

For example, after applying (step 26) the substance 31, both the remaining share of the trench filling material 32 and the remaining masking layer 13 within the trenches 11a, 11b can be removed. Then, the diffusion step 28 can be carried out so as to create the semiconductor regions 12a, 12b. In an embodiment, the diffusion step 28 may be performed in an oxidizing atmosphere, e.g., for avoiding out-diffusion of the substance 31 through the trench sidewalls 113a, 113b. Alternatively or additionally, an oxide may be deposited along the trench sidewalls 113a, 113b, e.g., at relatively low temperatures.

After the diffusion process, e.g., after the creation of the semiconductor regions 12a, 12b, the semiconductor device 1 can be further processed, wherein such further processing may include forming a control electrode (cf. control electrode 116a in FIG. 8) within the trench 11a, 11b. For example, such control electrode can be a gate electrode that is insulated from the semiconductor body 10 by a trench isolation material (not shown in FIG. 1-7). In addition, the further processing may include creating a semiconductor source region and a semiconductor body region adjacent to the trench 11a, 11b; e.g., for forming a MOS control head of a transistor cell. These aspects will be explained in more detail with regards to FIG. 8.

Concerning all embodiments, the application (step 26) of the substance 31 may include, as explained above, a plasma deposition processing step. For example, this plasma deposition processing step is implemented after a share of the trench filling material 32 has been removed and the section 111a, 111b of the trench 11a, 11b has been exposed. In alternative or in addition to the plasma deposition processing step, an implantation can be carried out, such as a vertical implantation along the vertical direction Z and/or a tilt angle implantation, wherein an angle of an ion beam of the tilt angle implantation may be smaller than 10°, as has been explained above. By means of the vertical implantation, a dopant concentration in deeper parts of the semiconductor regions 12a, 12b may be increased, wherein a tilt angle implantation may increase a dopant concentration at a region adjacent to a trench sidewall, e.g., in more upper parts of the semiconductor regions 12a, 12b. A combination of a tilt angle implantation, a vertical implantation and/or a plasma deposition may allow for achieving various dopant concentration profiles along the vertical direction Z within the created semiconductor region 12a, 12b. Examples of such dopant concentration profiles will be explained in more detail with regards to FIG. 9.

As has been illustrated in FIGS. 1 to 7, more than only one trench may be produced within the semiconductor body 10, for example at least two trenches 11a, 11b are produced and, of course, many more than two trenches may be produced within the semiconductor body 10 during step 21. In accordance with an embodiment schematically illustrated in FIG. 4-7, the semiconductor regions 12a and 12b are created within a mesa section 10-2 of the semiconductor body 10 that is laterally confined by one of the two sidewalls 113a and one of the two sidewalls 113b. For example, the distance between the two sidewalls of the different trenches 11a, 11b facing to each other along the first lateral direction X may amount to less than 10 µm, to less than 5 ☐m, to less than 2 ☐m, or to even less than 1 ☐m. To this end, the mask 4 may be formed such that also a section of the surface 10-1 above the mesa section 10-2 of the semiconductor body 10 remains exposed, i.e., not covered by the mask 4. The step of removing the masking layer 13 may also include removing, at least partially, the masking layer 13 that has been formed on top of the surface 10-1 above the mesa section 10-2. Then, during the application (step 26) of the substance 31, also at least a corresponding part of the surface 10-1 above the mesa section 10-2 may become subjected to the application of the substance 31, e.g., to the plasma deposition, the vertical and/or the tilt angel implantation and/or the masked diffusion. Accordingly, during the diffusion step (step 28), the substance 31 may also diffuse from the surface 10-1 above the mesa section 10-2 into the semiconductor body 10 along the vertical direction Z, thereby creating a further semiconductor region 19 illustrated in FIG. 7, wherein the further semiconductor region 19 and the created semiconductor region 12a and 12b may form a contiguous semiconductor region having dopants of the second conductivity type. After the diffusion process, a dopant concentration in the contiguous semiconductor region 19, 12a, 12b may further be adjusted by carrying out a surface implantation. For example, the semiconductor device 1 may be further processed after such contiguous semiconductor region 19, 12a, 12b has been formed, wherein such further processing may include forming a MOS control head arranged adjacent to the other ones of the trench sidewalls 113a and 113b that are not neighbored to the contiguous semiconductor region 12a, 19, 12b. This aspect will now be explained in more detail.

FIG. 8 schematically illustrates a section of a vertical cross-section of a power semiconductor transistor 5 (in the following also referred to as "transistor") comprising a semiconductor body 10 and at least one transistor cell 50. For example, the transistor 5 exhibits an IGBT- or a MOSFET-structure. The transistor cell 50 includes a semiconductor drift region 501 that has dopants of a first conductivity type. For example, the semiconductor drift region is an n-doped semiconductor region. Further, the transistor cell 50 includes a semiconductor body region 502 included in the semiconductor body 10 and having dopants of the second conductivity type. For example, the semiconductor body region 502 is a p-region. Further, the transistor 50 includes a source region 503, which may be a semiconductor source region 503, wherein the semiconductor body region 502 isolates the source region 503 from the semiconductor drift region 501.

The transistor cell 50 further includes a trench 11a that extends into the semiconductor body 10 along the vertical direction Z and that comprises a control electrode 116a that is electrically insulated from each of the semiconductor drift region 501, the semiconductor body region 502 and the source region 503. To this end, an insulator 117a may be included in the trench 11a that ensures said insulation. The control electrode 116a can be a gate electrode. Thus, the transistor cell 50 may include a MOS control head having a gate trench structure.

The power semiconductor transistor 5 may further include a first load terminal 51 and a second load terminal 52 that are coupled to the semiconductor body 10. For example, the transistor is configured to conduct a load current between the first load terminal 51 and the second load terminal 52, wherein the transistor 5 can be controlled by a control signal provided to the control electrode 116a. To this end, the control electrode 116a may be electrically connected to control terminal 53. The control terminal 53 can be a gate terminal, the first load terminal 51 can be a source terminal and the second load terminal 52 can be a drain terminal. Each of the source region 503 and the semiconductor body region 502 may be electrically connected to the first load terminal 51 by means of a first metallization 511. The second load terminal 52 can be electrically connected to the semiconductor body 10 by means of a second metallization 521. For example, the first metallization 511 is a front side metallization of the transistor 5, and the second metallization 521 is a backside metallization of the transistor 5. The transistor 5 can comprise a plurality of transistor cells 50.

The source region 503 and the semiconductor body region 502 may each be in contact with one of the two sidewalls 113a of the trench 11a, i.e., in contact with the insulator 117a, as schematically illustrated in FIG. 8.

Adjacent to the other one of the two trench sidewalls 113a, there may be included a semiconductor region 12a that has dopants of the second conductivity type. For example, the semiconductor region 12a is a p-doped semiconductor region.

For example, the semiconductor region 12a of the power semiconductor transistor 5 has been created in accordance with one or more embodiments of the method 2 described above with respect to FIG. 1-7.

For example, the semiconductor region 12a is arranged adjacent to the trench 11a, i.e., in contact with one of the trench sidewalls 113a and the trench bottom 114a. Further, the semiconductor region 12a may be arranged separately from the semiconductor body region 502. For example, a semiconductor body region 502 and the semiconductor region 12a are spatially isolated from each other by means of the trench 11a and the drift region 501. Also, as has been explained above, a further semiconductor region 19 (not illustrated in FIG. 8, cf. FIG. 7), may be arranged laterally adjacent to the semiconductor region 12a. What has been stated above regarding the further semiconductor region 19 may equally apply to the power semiconductor transistor 5.

Further, the semiconductor region 12a may be an electrically floating region. For example, the semiconductor region 12a is connected to none of the first load terminal 51, the second load terminal 52 and the control terminal 53, nor to any other defined electrical potential.

In accordance with an embodiment a dopant concentration of the semiconductor region 12a adjacent to the trench sidewall 113a amounts to a value that is within a range of 50% to 150%, within a range of 70% to 130%, or even within a range of 90% to 110% of a fixed dopant concentration value at any point along at least 60% of the total extension of the semiconductor region 12a in the vertical direction Z. Such substantially homogeneous dopant concentration distribution may be present for even more than 60% of the total extension in the vertical direction Z, for example for even more than 70%, 80%, 90%, or even more than 95%, such as more than 98% of the total extension of the semiconductor region 12a in the vertical direction Z. This kind of homogeneous dopant concentration along the vertical direction Z is schematically illustrated in FIG. 9, variant (A), which indicates the dopant concentration CC along the vertical direction Z. Thus, in accordance with variant (A), the dopant concentration CC does not deviate substantially from the fixed dopant concentration value CC1. Rather, it may be within the range of 90% to 110% of the fixed dopant concentration value CC1, wherein this range can be even smaller, such as 95% to 105% of the fixed dopant concentration value CC1, or even yet smaller, such as in between 98% to 102% of the fixed dopant concentration value CC1. In accordance with an embodiment, such substantially homogeneous dopant concentration along the vertical direction Z can be achieved by means of a tilt angle implantation or by means of a plasma deposition step, as has been exemplarily explained above with respect to method step 26.

In accordance with another embodiment, the dopant concentration CC of the semiconductor region 12a adjacent to the trench sidewall 113a changes, in a portion amounting to at least 80% of the total extension of the semiconductor region 12a in the vertical direction Z, by at least 30% from a dopant concentration value being present in said portion. For example, by applying (step 26) the substance 31 by a combination of a plasma deposition, a tilt angle implantation and/or a vertical implantation along the vertical direction Z and/or a masked diffusion, dopant profiles can be created within the semiconductor region 12a that exhibit significant changes in magnitude along the vertical direction Z.

For example, said portion amounting to at least 80% of the total extension of the semiconductor region 12a along the vertical direction Z may be divided into a first part 12a-1 and a second part 12a-2, as schematically illustrated in FIG. 9. It shall be understood that said portion may also amount to more than 85% of the total extension of the semiconductor region 12a along the vertical direction Z, to more than 90%, to more than 95% or to even more than 99% of the total extension of the semiconductor region 12a along the vertical direction Z.

In accordance with the variant schematically illustrated in FIG. 9 (B), the change of the dopant concentration in the portion is constituted by an increase along the vertical direction Z. Thus, within the first part 12a-1 and the second part 12a-2, the dopant concentration of the semiconductor region 12a may increase along the vertical direction Z, wherein said increase may amount to at least 30% of the fixed dopant concentration value CC1. In other words, in an upper section of the semiconductor region 12a, the dopant concentration CC may amount to the value CC1, and, at a lower section of the semiconductor region 12a, a dopant concentration CC may amount to at least 1.3*CC1.

In accordance with another embodiment that is schematically illustrated in FIG. 9 (C), said change of the dopant concentration in the portion may be constituted by a decrease along the vertical direction Z. Accordingly, the dopant concentration in an upper section of the semiconductor region 12a may amount to the value CC1, and, in said lower section, the dopant concentration CC of the semiconductor region 12a may amount to 0.7*CC1 at most.

In accordance with yet a further embodiment, the dopant concentration in the first part 12a-1 decreases along the vertical direction Z, and, in the second part 12a-2, the dopant concentration increases along the vertical direction Z. This embodiment is schematically illustrated in FIG. 9 (D). For example, such a dopant profile can be achieved by means of carrying out both a vertical implantation so as to apply the substance 31 substantially only to at least a section of the trench bottom 114a and by subjecting the surface 10-1 of the semiconductor body 10 to surface implantation. Thereafter, diffusion may be carried out, which may yield a dopant concentration profile as schematically illustrated in FIG. 9 (D).

As illustrated, first part 12a-1 may be an upper part of the semiconductor region 12a and the second part 12a-2 may be a lower part of the semiconductor region 12a. The decrease along the vertical direction Z in the first part 12a-1 may amount to at least 30% of an initial dopant concentration value being present adjacent to the surface 10-1 of the semiconductor body 10. Further, the increase along the vertical direction Z within the second part 12a-2 may also amount to at least 30% of a dopant concentration value being present at a transition between the first part 12a-1 and the second part 12-a2.

In accordance with all embodiments, a total extension of the semiconductor region 12a, 12b along the vertical direction Z may be within the range of 2 to 50 µm, within the range of 3 to 15 µm, or within the range of 4 to 10 µm. Instead of constituting an electrical floating region, the semiconductor region 12a, 12b can also be connected to a fixed electrical potential, such as the electrical potential of the first load terminal 51, the electrical potential of the gate terminal 53, to name a few. Thereby, a low voltage between the semiconductor region 12a and the control electrode 116a may be achieved, thereby reducing the electrical field within the trench insulator 116a.

Features of further embodiments are defined in the dependent claims. The features of further embodiments and the features of the embodiments described above may be combined with each other for forming additional embodiments, as long as the features are not explicitly described as being alternative to each other.

In the above, embodiments pertaining to semiconductor wafers and to methods and systems for processing a semiconductor wafer were explained. For example, these semiconductor wafers are based on silicon (Si). Accordingly, a monocrystalline semiconductor region or layer, e.g., the semiconductor regions 10 and 12a to 12b, 503, 502 of exemplary embodiments, can be a monocrystalline Si-region or Si-layer. In other embodiments, polycrystalline or amorphous silicon may be employed.

It should, however, be understood that the semiconductor regions 10 and 12a to 12b, 503, 502 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of processing a semiconductor device, comprising:
providing a semiconductor body having dopants of a first conductivity type;
forming a trench that extends into the semiconductor body along a vertical direction, the trench being laterally confined by two trench sidewalls and vertically confined by a trench bottom;
applying a substance onto a section of a trench surface of the trench, wherein the section is formed by at least one of a first trench sidewall of the two trench sidewalls and at least a portion of the trench bottom of the trench, and wherein applying the substance includes preventing the substance from being applied to a second sidewall of the two trench sidewalls; and diffusing of the applied substance from the section into the semiconductor body, thereby creating, in the semiconductor body, a semiconductor region having dopants of a second conductivity type and being arranged adjacent to the section, wherein the semiconductor region is arranged adjacent to only the first sidewall.

2. The method of claim 1, wherein applying the substance includes at least one of a plasma deposition, a tilt angle implantation, and an implantation along substantially only the vertical direction.

3. The method of claim 1, wherein the substance is gaseous, and applying the substance includes a masked diffusion.

4. The method of claim 1, further comprising, before applying the substance, carrying out a sputtering process for removing an oxide layer present at the section that came into being after forming the trench.

5. The method of claim 1, wherein the substance includes at least one of boron, aluminum and gallium.

6. The method of claim 1, wherein the substance includes at least one of phosphorus, antimony and arsenic.

7. The method of claim 1, wherein a transition between the trench and the created semiconductor region extends continuously along only the first trench sidewall to the trench bottom of the trench.

8. The method of claim 1, wherein semiconductor body is provided as a part of a semiconductor wafer having a diameter of at least 200 mm.

9. The method of claim 1, further comprising:
implanting dopants of the second conductivity type into the semiconductor body by carrying out a surface implantation.

10. The method of claim 1, further comprising, before applying the substance:

creating a masking layer at the trench surface;
filling the trench with a trench filling material;
forming a mask that only partially covers an opening of the trench; and
removing both a share of the trench filling material that is not covered by the mask and a part of the masking layer adjacent to the share so as to expose only the section of the trench surface that is subjected to a subsequent application of the substance.

11. The method of claim 10, further comprising, after applying the substance:

removing both a remaining share of the trench filling material and a remaining masking layer within the trench, and, subsequently, diffusing the applied substance from the section into the semiconductor body.

12. The method of claim 1, further including:
forming a control electrode within the trench.

13. The method of claim 1, wherein applying the substance and diffusing the applied substance are carried out such that a dopant concentration of the created semiconductor region adjacent to the first trench sidewall amounts to a value that is within a range of 50% to 150% of a fixed dopant concentration value at any point along at least 60% of a total extension of the semiconductor region in the vertical direction.

14. The method of claim 1, wherein applying the substance and diffusing the applied substance are carried out such that a dopant concentration of the semiconductor region adjacent to the first trench sidewall changes, in a portion amounting to at least 80% of a total extension of the semiconductor region in the vertical direction, by at least 30% from a dopant concentration value being present in the portion of the total extension.

* * * * *